United States Patent [19]
Arai et al.

[11] Patent Number: 5,406,145
[45] Date of Patent: Apr. 11, 1995

[54] PUSH-PULL-TYPE AMPLIFIER CIRCUIT

[75] Inventors: Masanobu Arai; Noriaki Edasawa, both of Tokyo, Japan

[73] Assignee: NEC Corporation, Tokyo, Japan

[21] Appl. No.: 160,812

[22] Filed: Dec. 3, 1993

[30] Foreign Application Priority Data

Dec. 22, 1992 [JP] Japan .................. 4-342670

[51] Int. Cl.$^6$ .......................... H03F 1/30; G06G 7/10
[52] U.S. Cl. ................................ 327/362; 330/253; 327/379; 327/427
[58] Field of Search ............ 307/491, 571, 572, 296.5, 307/270, 443, 500, 501; 330/253, 257, 264; 323/315, 316

[56] References Cited

U.S. PATENT DOCUMENTS

| | | | |
|---|---|---|---|
| 4,342,004 | 7/1982 | Iida et al. | 330/253 |
| 4,524,328 | 6/1985 | Abou et al. | 330/253 |
| 4,524,329 | 6/1985 | Abou | 330/253 |
| 4,580,070 | 4/1986 | Westman | 307/571 |
| 4,912,425 | 3/1990 | Kobayashi et al. | 330/253 |
| 5,057,789 | 10/1991 | Nagaraj | 330/253 |
| 5,200,654 | 4/1993 | Archer | 307/491 |

FOREIGN PATENT DOCUMENTS

WO93/0066-55  4/1993  WIPO .

Primary Examiner—Timothy P. Callahan
Assistant Examiner—Toan Tran
Attorney, Agent, or Firm—Foley & Lardner

[57] ABSTRACT

A push-pull-type amplifier circuit has three current mirror circuits CM1, CM2, CM3 and transistors M6, M7 connected between a reference current supply $I_R$ and output transistors M2, M3 for controlling an idling current flowing through the output transistors M2, M3 so as to be proportional to a current flowing through the reference current supply $I_R$ so that the idling current will be stabilized irrespective of variations in a power supply voltage. An operational amplifier which incorporates the push-pull-type amplifier circuit as an output stage circuit is highly stable in operation, and can be designed in a simple arrangement without having to take into account power supply voltage variations.

3 Claims, 2 Drawing Sheets

PUSH-PULL-TYPE AMPLIFIER CIRCUIT

BACKGROUND OF THE INVENTION

1. Field of the Invention

The present invention relates to an amplifier circuit, and more particularly to a push-pull-type amplifier circuit employing a stable idling current.

2. Description of the Prior Art

One conventional amplifier circuit of the type will be described below with reference to FIG. 1 of the accompanying drawings.

The push-pull-type amplifier circuit shown in FIG. 1 comprises input terminal IN, power supply terminal 1, first, second, and third transistors M1, M2, M3, reference current supply $I_R$, and output terminal OUT. It is assumed that the first, second, and third transistors M1, M2, M3 have respective gate-to-source voltages $V_{GS1}$, $V_{GS2}$, $V_{GS3}$, respective drain currents $I_{D1}$, $I_{D2}$, $I_{D3}$, respective transistor gain coefficients $\beta_1$, $\beta_2$, $\beta_3$, and a threshold voltage $V_T$, and that a power supply voltage $V_{DD}$ is applied to power supply terminal 1 and a current $i_R$ flows through reference current supply $I_R$. An idling current $I_0$, which flows when $I_{D2}=I_{D3}$, is determined according to the following equations:

$$i_R = I_{D1} = (1/2) \cdot \beta_1 \cdot (V_{GS1} - V_T)^2 \quad (1)$$
$$I_{D2} = (1/2) \cdot \beta_2 \cdot (V_{GS2} - V_T)^2 \quad (2)$$
$$I_{D3} = (1/2) \cdot \beta_3 \cdot (V_{GS3} - V_T)^2 \quad (3)$$
$$V_{GS2} + V_{GS3} = V_{DD} - V_{GS1} \quad (4)$$
$$I_0 = I_{D2} = I_{D3}. \quad (5)$$

The conventional push-pull-type amplifier circuit outputs an idling current $I_0$ depending on the power supply voltage $V_{DD}$ that is applied to power supply terminal 1. For example, if $V_T=0.7$ V and $V_{GS1}=2.5$ V, the idling current $I_0$ when $V_{DD}=5.5$ V and 4.5 V is given as follows:

(1) When $V_{DD}=4.5$ V, if $V_{GS2}=V_{GS3}=V_{GS}$, then $V_{GS}=1.0$ (V) from the equation (4). If $\beta_2=\beta_3=\beta$, then from the equations (1), (2), (3), $I_0=I_{D2}=I_{D3}=(\frac{1}{2})\cdot\beta\cdot(V_{GS}-V_T)^2=(\frac{1}{2})\cdot\beta\cdot(1.0-0.7)^2=(\frac{1}{2})\cdot\beta\times 0.09$.

(2) When $V_{DD}=5.5$ V, $V_{GS2}+V_{GS3}=V_{DD}-V_{GS1}=5.5-2.5=3.0$ (V) from the equation (4). If $V_{GS2}=V_{GS3}=V_{GS}$, then $V_{GS}=1.5$ (V). If $\beta_2=\beta_3=\beta$, then from the equations (1), (2), (5), $I_0=I_{D2}=I_{D3}=(\frac{1}{2})\cdot\beta\cdot(V_{GS}-V_T)^2=(\frac{1}{2})\cdot\beta\cdot(1.5-0.7)^2=(\frac{1}{2})\cdot\beta\times 0.64$.

From (1) and (2) above, $$I_0(V_{DD}=4.5 \text{ V}):I_0(V_{DD}=5.5 \text{ V})=1.0:7.1.$$

The mutual conductance gm ($=\sqrt{2\beta I_0}$) of the output transistor when $V_{DD}=5.5$ V greatly differs from that when $V_{DD}=4.5$ V.

When a load capacitor $C_L$ (not shown) is connected to output terminal OUT, the gain bandwidth (GB product) of the amplifier circuit is expressed as follows:

$$GB=gm/2\pi C_L.$$

If the amplifier circuit is used as the output stage circuit of a well-known two-stage operational amplifier composed of a differential stage circuit and an output stage circuit, then since the bandwidth of the output stage circuit greatly varies depending on the power supply voltage $V_{DD}$, the operational amplifier has poor stability and tends to oscillate easily.

SUMMARY OF THE INVENTION

It is therefore an object of the present invention to provide a push-pull-type amplifier circuit employing an idling current which does not depend on changes in a power supply voltage.

According to the present invention, there is provided a push-pull-type amplifier circuit comprising an input terminal, a first transistor having a gate connected to the input terminal and a drain connected to a first power supply terminal, a second transistor having a gate connected to the input terminal and a source connected to the first power supply terminal, the second transistor being opposite in polarity to the first transistor, a third transistor having a gate connected to the source of the first transistor, a drain connected to the drain of the second transistor, and a source connected to a second power supply terminal, the third transistor being opposite in polarity to the second transistor, an output terminal connected to the drains of the second and third transistors, a first current mirror circuit composed of a fourth transistor having a source connected to the first power supply terminal and a fifth transistor having a source connected to the first power supply terminal, the fourth and fifth transistors being of the same polarity, a reference current supply having one terminal connected to an input terminal of the first current mirror circuit which is connected to the gates of the fourth and fifth transistors, and the other terminal connected to the second power supply terminal, a sixth transistor having a drain and a gate connected to an output terminal of the first current mirror circuit which is connected to the drain of the fifth transistor, the sixth transistor being opposite in polarity to the fourth transistor, a seventh transistor having a source to which the gate-to-source voltage of the sixth transistor is applied through a voltage follower circuit, and a gate connected to the input terminal of the first current mirror circuit, the seventh transistor being of the same polarity as the sixth transistor, a second current mirror circuit having an input terminal supplied with a drain current from the seventh transistor, and a third current mirror circuit having an input terminal supplied with an output current from the second current mirror circuit, the third current mirror circuit being connected so that the output current of the third current mirror circuit is the source current from the first transistor.

The first, second, and third current mirror circuits and the sixth and seventh transistors are connected between the reference current supply and the output transistors, i.e., the second and third transistors, for controlling an idling current so as to be proportional to a current flowing through the reference current supply. Therefore, the idling current is rendered stable even when the power supply voltage varies.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

Figure 1:
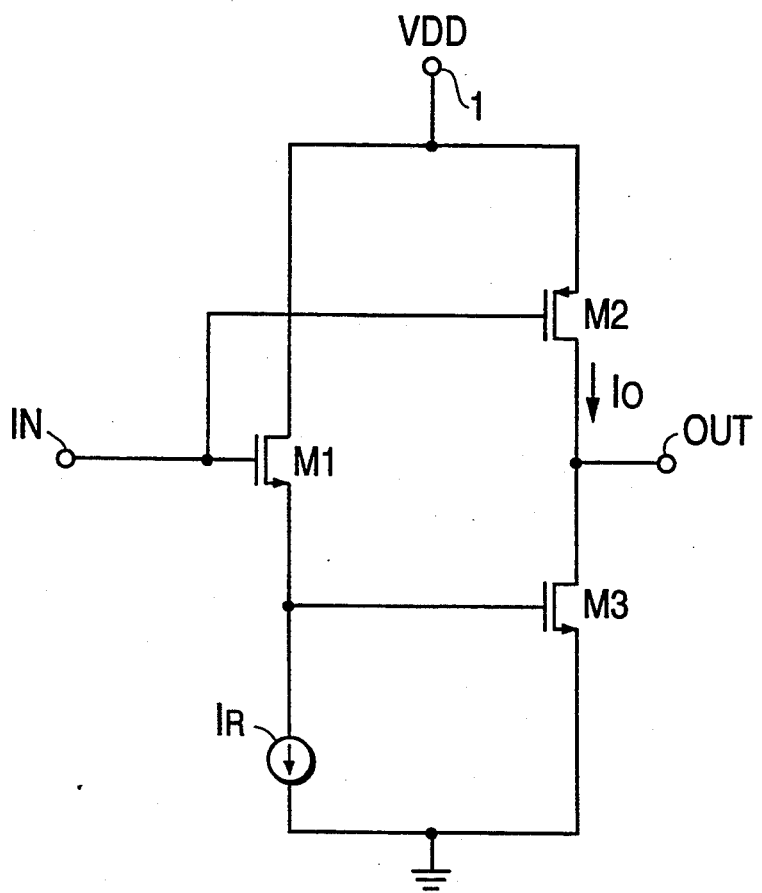
FIG. 1 is a circuit diagram of a conventional push-pull-type amplifier circuit.
Figure 2:
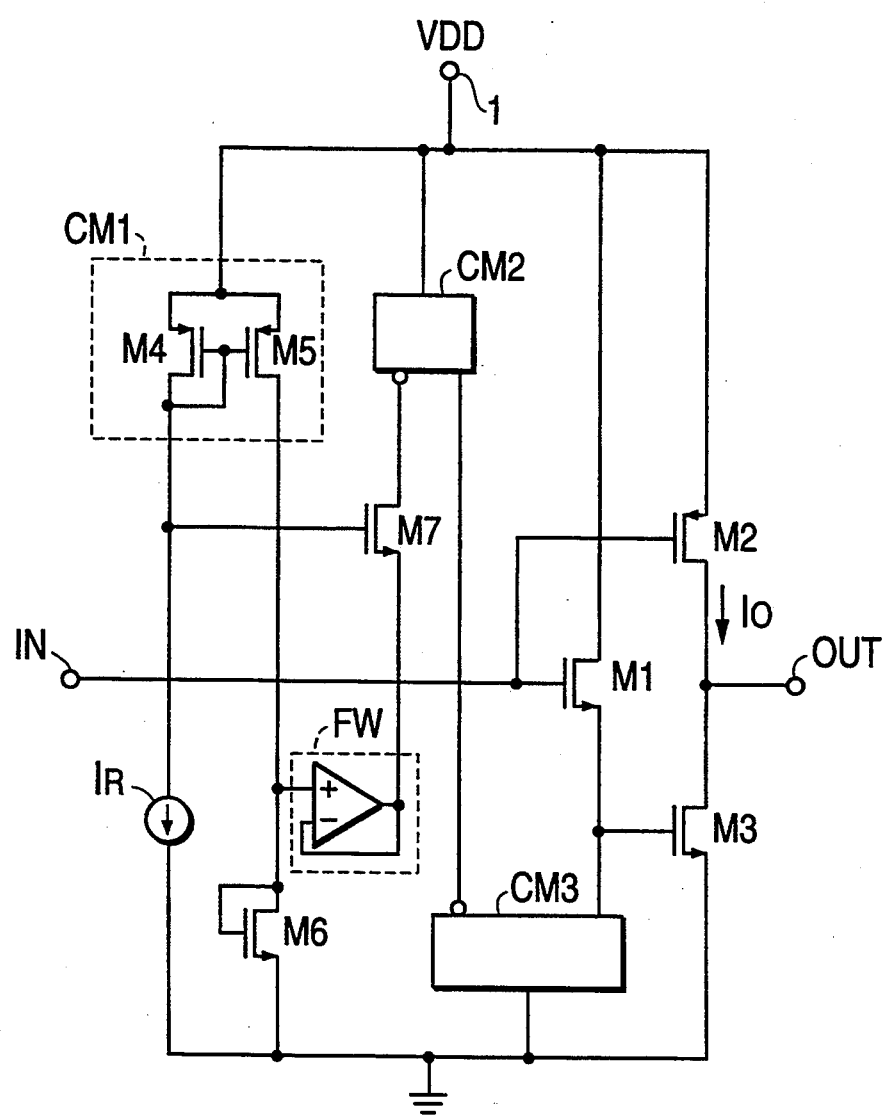
FIG. 2 is a circuit diagram of a push-pull-type amplifier circuit according to an embodiment of the present invention.

As shown in FIG. 2, a push-pull-type amplifier circuit according to an embodiment of the present invention comprises input terminal IN, first transistor M1 having a gate connected to input terminal IN and a drain connected to power supply terminal 1, second transistor M2 having a gate connected to input terminal IN and a source connected to power supply terminal 1, second transistor M2 being opposite in polarity to first transistor M1, third transistor M3 having a gate connected to the source of first transistor M1, a drain connected to the drain of second transistor M2, and a source connected to ground, third transistor M3 being opposite in polarity to second transistor M2, and output terminal OUT connected to the drains of second and third transistors M2, M3.

The push-pull-type amplifier circuit also includes first current mirror circuit CM1 composed of fourth transistor M4 having a source connected to power supply terminal 1 and fifth transistor M5 having a source connected to power supply terminal 1, the fourth and fifth transistors M4, M5 being of the same polarity, reference current supply $I_R$ having one terminal connected to an input terminal of the first current mirror circuit CM1, connected to the gates of the fourth and fifth transistors M4, M5, and the other terminal connected to ground, sixth transistor M6 having a drain and a gate connected to an output terminal of first current mirror circuit CM1, connected to the drain of fifth transistor M5, sixth transistor M6 being opposite in polarity to fourth transistor M4, seventh transistor M7 having a source to which the gate-to-source voltage of the sixth transistor M6 is applied through voltage follower circuit FW, and a gate connected to the input terminal of first current mirror circuit CM1, seventh transistor M7 being of the same polarity as sixth transistor M6, second current mirror circuit CM2 having an input terminal supplied with a drain current from seventh transistor M7, and third current mirror circuit CM3 having an input terminal supplied with an output current from second current mirror circuit CM2. Third current mirror circuit CM3 is connected so taht the output current of third current mirror circuit CM3 is the source current from first transistor M1.

Operation of the push-pull-type amplifier circuit shown in FIG. 2 will be described below.

A voltage $V_{GS4}$ is developed between the gate and source of fourth transistor M4 by a current flowing through reference current supply $I_R$. If the current transmission ratio, i.e., the ratio of input and output currents, of first current mirror circuit CM1 is 1:1, then a voltage $V_{GS6}$ is developed between the gate and source of sixth transistor M6 by an output current from first current mirror circuit CM1 which is of a magnitude equal to that of the current flowing through reference current supply $I_R$. The gate-to-source voltage $V_{GS7}$ of seventh transistor M7 is a voltage having a value which is produced by subtracting the gate-to-source voltages $V_{GS4}$ and $V_{GS6}$ from a power supply voltage $V_{DD}$ applied to power supply terminal 1. Therefore, a drain current $I_{D7}$ $(=(\frac{1}{2}) \cdot \beta \cdot (V_{GS7} - V_T)^2)$ becomes an input current supplied to second current mirror circuit CM2. If second and third current mirror circuits CM2, CM3 have a current transmission ratio of 1:1, then a current whose magnitude is equal to the drain current $I_{D7}$ flows to first transistor M1, developing a voltage $V_{GS1}$ between the gain and source of first transistor M1. At this time, the gate-to-source voltages $V_{GS1}$, $V_{GS7}$ of first and seventh transistors M1, M7 are equal to each other insofar as first and seventh transistors M1, M7 are of the same size.

Therefore, the gate-to-source voltage $V_{GS2}$ of second transistor M2 is the same as the gate-to-source voltage $V_{GS4}$ of fourth transistor M4, and the gate-to-source voltage $V_{GS3}$ of third transistor M3 is the same as the gate-to-source voltage $V_{GS6}$ of sixth transistor M6. Consequently, the gate-to-source voltages $V_{GS2}$, $V_{GS3}$ of second and third transistor M2, M3, which are output transistors, do not depend on changes in the power supply voltage $V_{DD}$ applied to power supply terminal 1, but on the current flowing through reference current supply $I_R$. That is, the idling current $I_0$ is proportional to only the current flowing through reference current supply $I_R$.

While the current transmission ratio of each of current mirror circuits M1, M2, M3 is 1:1 in the above embodiment, it can easily be understood that the push-pull-type amplifier circuit operates in the same manner as described above if the current mirror circuits M1, M2, M3 have other current transmission ratios.

As described above, the push-pull-type amplifier circuit according to the present invention employs an idling current which does not depend on changes in the power supply voltage. The push-pull-type amplifier circuit can be designed for a simple circuit arrangement without having to take into account changes in the power supply voltage.

Inasmuch as the idling current does not increase or decrease abnormally, the transistors are free from the danger of characteristic degradation and thermal breakdown. Since the mutual conductance gm of the output transistors remains constant, if the push-pull-type amplifier circuit is used as an output stage circuit of an operational amplifier, then the operational amplifier has good stability and is not susceptible to oscillation.

Although a certain preferred embodiment of the present invention has been shown and described in detail, it should be understood that various changes and modifications may be made therein without departing from the scope of the appended claim.

What is claimed is:

1. A push-pull-type amplifier circuit comprising:
   an input terminal;
   a first transistor having a gate connected to said input terminal and a drain connected to a first power supply terminal;
   a second transistor having a gate connected to said input terminal and a source connected to said first power supply terminal, said second transistor being opposite in polarity to said first transistor;
   a third transistor having a gate connected to the source of said first transistor, a drain connected to the drain of said second transistor, and a source connected to a second power supply terminal, said third transistor being opposite in polarity to said second transistor;
   an output terminal connected to the drains of said second and third transistors;
   a first current mirror circuit composed of a fourth transistor having a source connected to the first power supply terminal and a fifth transistor having a source connected to the first power supply terminal, said fourth and fifth transistors being of the same polarity;

a reference current supply having one terminal connected to an input terminal of said first current mirror circuit which is connected to the gates of said fourth and fifth transistors, and the other terminal connected to the second power supply terminal;

a sixth transistor having a drain and a gate connected to an output terminal of said first current mirror circuit which is connected to the drain of said fifth transistor, said sixth transistor being opposite in polarity to said fourth transistor;

a seventh transistor having a source to which the gate-to-source voltage of said sixth transistor is applied through a voltage follower circuit, and a gate connected to the input terminal of said first current mirror circuit, said seventh transistor being of the same polarity as said sixth transistor;

a second current mirror circuit having an input terminal supplied with a drain current from said seventh transistor; and a third current mirror circuit having an input terminal supplied with an output current from said second current mirror circuit;

said third current mirror circuit being connected so that the output current of the third current mirror circuit is the source current from said first transistor.

2. A push-pull-type amplifier circuit as set forth in claim 1, wherein the transmission ratio of each of said first, second and third current mirror circuits is 1:1.

3. A push-pull-type amplifier circuit as set forth in claim 1, wherein the transmission ratio of each of said first, second and third current mirror circuits is other than 1:1.

* * * * *